United States Patent
Chang et al.

(10) Patent No.: US 8,397,183 B2
(45) Date of Patent: Mar. 12, 2013

(54) GENERATION OF ASYMMETRIC CIRCUIT DEVICES

(75) Inventors: Leland Chang, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 12/699,621

(22) Filed: Feb. 3, 2010

(65) Prior Publication Data

US 2011/0191737 A1    Aug. 4, 2011

(51) Int. Cl.
*G06F 17/50* (2006.01)

(52) U.S. Cl. .......................... 716/55; 716/101; 716/139

(58) Field of Classification Search .................. 716/55, 716/101, 139
See application file for complete search history.

(56) References Cited

U.S. PATENT DOCUMENTS

| | | | |
|---|---|---|---|
| 7,269,804 B2 | 9/2007 | Tabery et al. | |
| 8,089,100 B2 * | 1/2012 | Becker et al. | 257/206 |
| 2004/0222466 A1 | 11/2004 | Fried et al. | |
| 2005/0138579 A1 | 6/2005 | Narendra et al. | |
| 2005/0166175 A1 | 7/2005 | Liebmann et al. | |
| 2005/0188338 A1 | 8/2005 | Kroyan et al. | |
| 2006/0150131 A1 | 7/2006 | Lai et al. | |
| 2006/0253813 A1 | 11/2006 | Rittman | |
| 2008/0111185 A1 | 5/2008 | Cheng | |
| 2009/0020806 A1 | 1/2009 | Anderson et al. | |
| 2009/0032845 A1 | 2/2009 | Zhu et al. | |

* cited by examiner

*Primary Examiner* — Thuan Do
(74) *Attorney, Agent, or Firm* — Scully, Scott, Murphy & Presser, P.C.; Vazken Alexanian

(57) ABSTRACT

A method, system and computer program product are disclosed for creating the appropriate block level shapes to manufacture asymmetric field effect transistors (FETs). In one embodiment, the method comprises obtaining an integrated circuit design having an active region level (RX) and a gate region level (PC), each of the RX and PC levels having a multitude of shapes representing semiconductor regions; and defining a new level SD having a multitude of SD level shapes from the RX and the PC level shapes. This method further comprises identifying which ones of the new shapes are source regions and which ones are drain regions; determining which ones of the source regions are pointing up and which ones are pointing down; and copying the shapes of source regions that are pointing up and the shapes of the source regions that are pointing down onto additional, defined levels.

25 Claims, 6 Drawing Sheets

- RESIST BLOCK SYMMETRIC USING 'BH' MASK
- IMPLANT SOURCE SIDE FOR ASYMMETRIC HALO
- REQUIRES 4 ASYMMETRIC MASKS TOTAL (ONE FOR SOURCE 'UP'), ONE FOR (SOURCE 'DOWN'), X2 FOR N AND P

- RESIST BLOCK ASYMMETRIC USING 'AG' OR 'AH'
- IMPLANT ONE SIDE OF SYMMETRIC HALO

GENERATION OF ASYMMETRIC CIRCUIT DEVICES

FIELD OF THE INVENTION

This invention generally relates to manufacturing asymmetric integrated circuit devices, and more specifically, to generating the appropriate block level shapes to manufacture field effect transistors.

BACKGROUND ART

A specialized field, commonly referred to as "electronic design automation" (EDA), has evolved to handle the demanding and complicated task of designing, laying out and verifying integrated circuit (IC) semiconductor chips. In EDA, computers are extensively used to automate the design, layout and verification process. The first step of the EDA design process typically involves the formal specification of the design, using hardware design languages such as Verilog or VHDL, and synthesis of the design into netlists of devices to be placed and routed. Typically, the synthesized design is stored on a computer tape or disk. The next step of the process typically involves the use of circuit simulation software to test the synthesized design of the IC to see if it operates as needed.

Once the IC design has been verified through computer simulation, the third step in the EDA design process is the use of layout software to generate component placement and interconnections for the components. However, before fabrication on the semiconductor chip begins, extensive further verification and/or testing are typically performed to further verify and check that the IC has been properly designed and physically laid out. This is accomplished in a fourth step of the EDA design process wherein design checks are performed, and IC simulation software and/or emulation system are used to test the operation and performance of the proposed IC. A pre-defined set of rules are also stored. These rules may specify certain dimensions and other criteria for checking to determine whether the new design has been properly laid out. Thereafter, simulation and/or emulation may be performed. Hence, new designs and layouts are subject to a host of rigorous verification and testing procedures, including procedures which check the physical layout to ensure that it meets certain well-established rules or guidelines.

Often, several iterations of the design, layout, and verification process are required in order to optimize the IC's size, cost, heat output, speed, power consumption, and electrical functionalities. After the IC design has been established to be good, the fifth step in the EDA process involves the use of mask fabrication software to generate masks for manufacturing the ICs, which are then used to manufacture IC prototypes. These IC prototypes are further tested by automated test equipment (ATE).

The use of asymmetric transistors in SOI technologies is now widespread, and one major implementation issue is the impact the use of asymmetric FET has on the design and layout of the integrated circuit. Typically, block mask shapes that define the asymmetric FETs must be placed in the design in every instance an asymmetric FET is required. This alone is not sufficient, as the asymmetric FET will be either 'source up' or 'source down' (when the poly gates are restricted to be only horizontal, as is common in CMOS technologies at the 90 nm node and beyond). The two possible FET orientations for every instance of design cell mean that just identifying sources is not enough. It is also necessary to identify, relative to the wafer notch, if the source is on the top or bottom. To accomplish this in design is impractical, as design is hierarchical.

BRIEF SUMMARY

Embodiments of the invention provide a method, system and computer program product for creating the appropriate block level shapes to manufacture asymmetric field effect transistors (FETs). In one embodiment, the invention provides a method of generating block level shapes to manufacture asymmetric field effect transistors (FETS) comprising obtaining an integrated circuit design having a multitude of levels including an active region level (RX) and a gate region level (PC), each of the RX and PC levels having a multitude of shapes representing semiconductor regions; and defining a new level SD having a multitude of SD level shapes from the RX level shapes and the PC level shapes, and whereby two new SD level shapes result from each of the RX level shapes, and one of said two new SD level shapes is a source region and the other of said two new SD level shapes is a drain region. In this embodiment, the SD shape is defined as the geometrical subtraction of the shapes on the PC level from the shapes on the RX level.

This embodiment of the invention further comprises identifying which ones of the new shapes are source regions, and which ones of the new shapes are drain regions; determining which ones of the identified source regions are pointing up and which ones of the identified source regions are pointing down, according to defined rules for the integrated circuit design; defining a plurality of additional levels; and copying the shapes of source regions that are pointing up and the shapes of the source regions that are pointing down onto said additional levels.

In one embodiment, the identifying includes identifying which ones of the identified source regions are NFET source regions, which ones of the identified source regions are PFET source regions. In an embodiment, the defining a plurality of additional levels includes defining a first set of additional levels, and defining a second set of additional levels; and the copying includes copying the shapes of the NFET source regions onto the first set of additional levels, and copying the shapes of the PFET source regions onto the second set of additional levels.

In an embodiment, the integrated circuit design includes a Vdd node and a Vss node; and the step of identifying which ones of the identified source regions are NFET source regions, and which ones of the identified source regions are PFET source regions includes using said Vdd node and said Vss node to identify which ones of the identified source regions are NFET source regions, and which ones of the identified source regions are PFET source regions. In one embodiment, the using the Vdd node and the Vss node includes identifying the new source regions that trace to the Vss node as NFET source regions, and identifying the new source regions that trace to the Vdd node as PFET source regions.

In one embodiment, the determining which ones of the identified source regions are pointing up and which ones of the identified source regions are pointing down, includes generating a display of said identified source regions and using said view to identify which ones of the identified source regions are pointing up and which ones of the identified source regions are pointing down. In an embodiment, the generating a display includes generating a hierarchical display of the identified source regions, wherein said identified source regions are shown in a hierarchical order; removing said hierarchical order from the hierarchical display to show the identifies source regions in flattened order; and using said flattened display of the identifies source regions to determine which ones of the source regions are pointing up and which ones of the source regions are pointing down.

DETAILED DESCRIPTION

Figure 1:
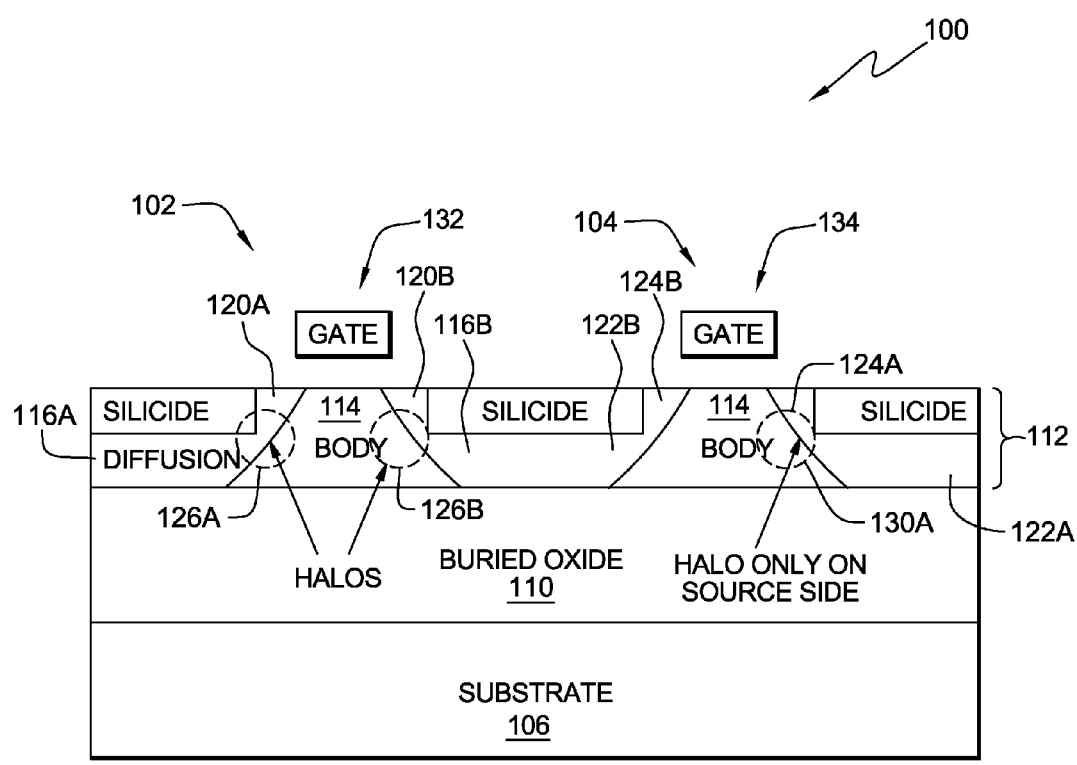
FIG. 1 illustrates a semiconductor device having symmetric and asymmetric FET device regions.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium, upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The present invention, generally, provides a method, system and computer program product for generating block level shapes to manufacture asymmetric FETs. FIG. 1 illustrates a cross-sectional view through a semiconductor device 100 including a symmetric FET 102 and an asymmetric FET 104. Device 100, more specifically, comprises substrate 106, a buried oxide layer 110, and a top semiconductor layer 112. The top semiconductor layer 112 comprises bodies 114, and source and drain regions and source and drain extension regions for each of the FETs 102, 104. In particular, FET 102 includes source region 116A, drain region 116B, source extension region 120A, and drain extension region 120B; and FET 104 includes source region 122A, drain region 122B, source extension region 124A, and drain extension region 124B. The symmetric FET 102 includes source and drain halo regions 126A, 126B, while the asymmetric FET 104 includes a halo region 130A only on the source side.

FET 102 includes gate 132, and FET 104 includes gate 134. Each gate includes a gate dielectric located directly on a portion of top semiconductor layer 112, a gate conductor above the gate dielectric, and a top gate metal semiconductor alloy. In each FET, the body 114 and the halo region or regions are doped with a first conductivity type doping, which may be a p-type doping or an n-type doping. In each FET, the halo regions or region have a higher doping concentration than the body 114. The deep source region and the deep drain regions are doped with a second conductivity type, which is the opposite of the first conductivity type doping.

Figure 2A:
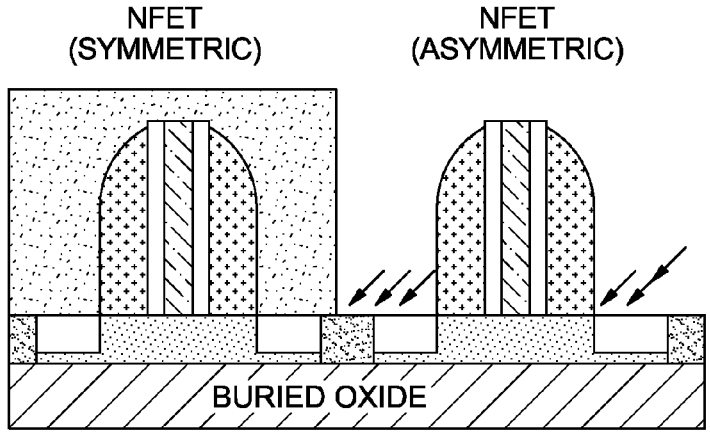
FIGS. 2A, 2B and 2C show a procedure for forming halo regions in the FET device regions of FIG. 1.
Figure 2B:
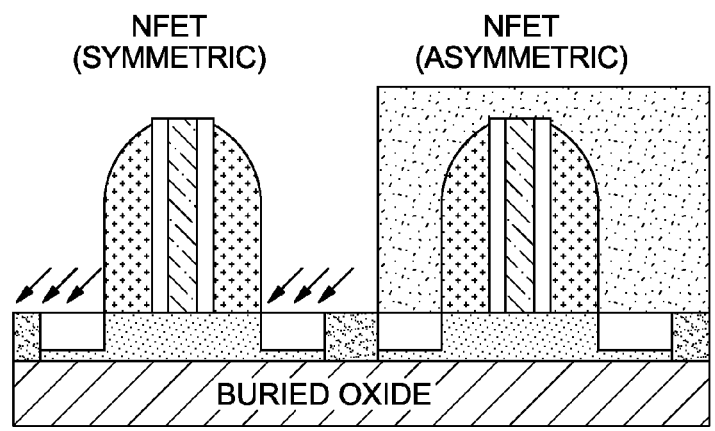
Figure 2C:
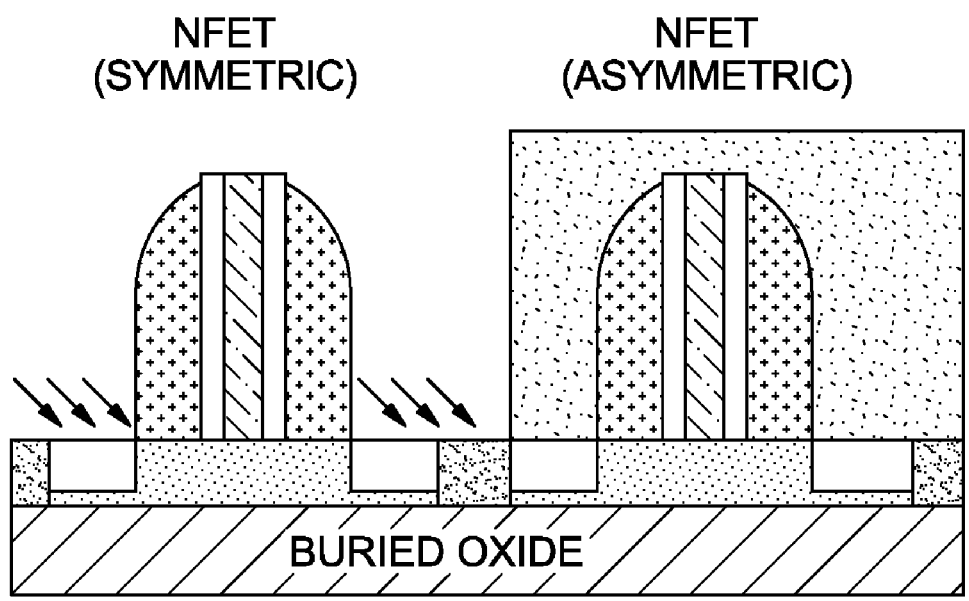

FIGS. 2A, 2B and 2C illustrate a procedure for implanting the halo regions 126A, 126B, 130A in device 100. As shown in FIG. 2A, each gate 132, 134 is provided with at least one gate spacer 136, 140 respectively, and FET 102 is covered with a mask 142. The desired ion implantation is performed at a specific angle, to form source side halo region 130A. As shown in FIG. 2B, mask 142 is removed from the gate 132 of FET 102, and the gate 134 of FET 104 is covered with mask 144. An ion implantation, at a given angle, is used to form side 126B of the symmetric halo and, as depicted in FIG. 2C, another ion implantation, at a given angle, is performed to form the second side 126A of the symmetric halo.

Figure 3:
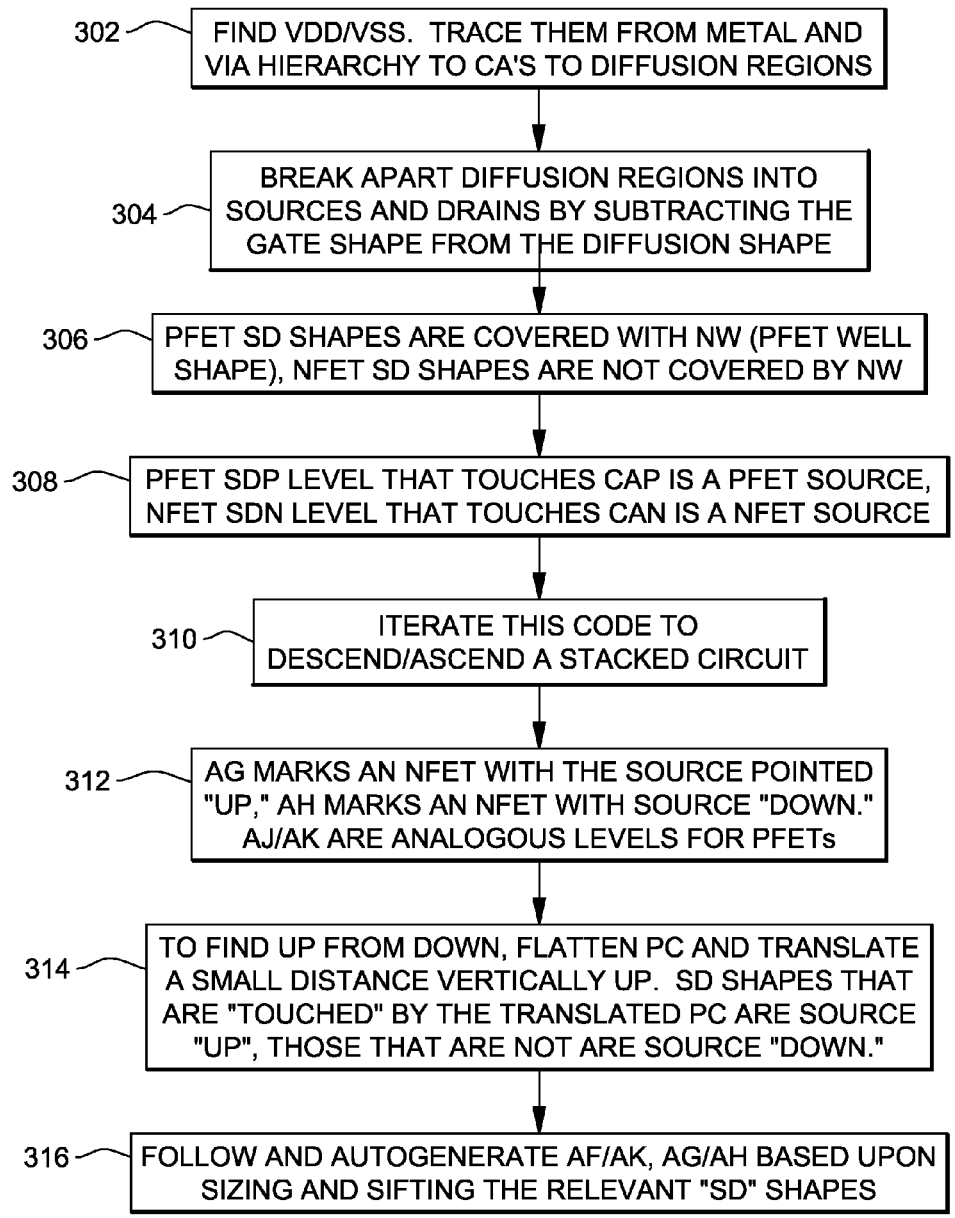
FIG. 3 shows a method in accordance with an embodiment of the invention.

FIG. 3 shows a procedure that, in one embodiment of the invention, may be used to generate block level shapes to manufacture asymmetric FETs such as FET 102. In this procedure, at step 302, Vdd and Vss are found. These may be found by tracing them from metal and via hierarchy to a contact level's (CA's) diffusion regions. Step 304 is to break apart diffusion regions into sources and drains; and, as discussed below, this may be done by subtracting gate shapes from diffusion shapes. At step 306, PFET shapes in a level referred to as SD, are covered with the PFET well region, and the NFET SD shapes are not covered by the PFET well region. At step 308, in a procedure described in detail below, a PFET SDP level that touches a structure referred to as a CAP is identified as a PFET source, and an NFET SDP level that touches a structure referred to as CAN is identified as a NFE source. As represented at step 310, this code may be iterated to descend/ascend a stacked circuit.

Step 312 relates to the use of additional layers, referred as AG, AH, AJ and AK, created in an embodiment of the invention. AG marks an NFET with the source pointed up, and AH marks an NFET with source down. AJ and AK are analogous levels for PFETs. Step 314 relates to a process, also described below, to find up from down relative to a wafer. Generally, this process is to flatten the PC layer and translate it a small distance vertically up. SD shapes that are "touched" by the translated PC are source "Up," and those that are not touched are source "Down." Step 316 is to follow and autogenerate AJ/AK, AG/AH based upon sizing and shifting the relevant SD shapes The procedure of FIG. 3 is discussed in detail below.

Assume a circuit design in layout using conventional levels: RX=active silicon region, PC=gate region, NW=pfet region, CA=contact level to RX region (usually tungsten), M1=metal one level (usually copper or aluminum) [higher levels of metals and vias may also be present, i.e., V1, M2, V2, M3, V3, M4, . . . ]. This layout, created in a CAD system, is ultimately used to create masks used in the fabrication of CMOS circuits. To enable asymmetric FETs, of particular concern for their higher performance in SOI (silicon-on-insulator) CMOS technologies, four additional layout levels are required to control the use of the implants required build asymmetric FETs. These levels, referred to as asymmetric levels, can be represented as AG, AH, AJ, AK.

AG and AH are used for NFETs, where AG is used for NFETs with the source region pointing up and AH is used for source pointing down. AJ and AK are used for PFETs, where AJ is used for PFETs with the source region pointing up and AK is sued for source pointing down. The definition of up and down are we reference to a silicon wafer, which typically has a notch or flat defining the 0 degree point with respect to a crystallographic orientation. In most modern CMOS technologies, the gate (PC level) is restricted to run in one direction (in the current example, assume left/right or horizontal). Assuming the 0 degree point for the wafer is located down, then the implants for asymmetry would typically be performed at a tilt angle with respect to the device's source side of the gate at 5-60 degrees, with a rotation of 0 degrees for source down and 180 degrees for source up.

The four asymmetric levels are placed over the gate regions (PC) and a portion of the active silicon regions (RX), determined specifically be the groundrules of the given technology. The masks will open a region around the gate of a FET to receive the appropriate implants, while blocking the implants from the other FETs (i.e., a block mask for the other FETs).

Layouts typically use text labels to notate the Vdd node and Vss node in the circuit layouts. These labels are typically at the highest metal level used in the layout, or on their open special level used for documentation of the layout. The Vss label will be used later to determine the NFET source, as it will be connected to the NFET source through the metal/via/contact hierarchy. Similarly, the Vdd label will be used to determine the PFET source.

Step 304, as mentioned above, is to break apart the diffusion regions by subtracting the gate (PC) shape from the diffusion shape. This new level is referred to as "SD" (SD=RX−PC).

A design tool, such as the Calibre design tool (available from Mentor Graphics) may be used to perform geometric operations on these shapes. An algorithm is created can manipulate existing shapes in the design to automatically generate the new asymmetric shapes, thus avoiding the need to draw these shapes in a CAD tool for every FET in the initial non-asymmetric layout design. Given the need to quickly re-generate many pre-existing designs for asymmetric FETs, such a conversion ability is highly desirable to avoid the large amount of layout labor required to manually add the shapes.

Consider the general layout case of a single gate fingered FET. In layout, a gate shape (PC) will bisect an active silicon shape (RX). If a new level, SD is defined as the difference of the RX shape and the PC shape (RX−PC), two regions then result from the initial RX shape. One of these shapes is a source and the other shape is a drain. Determining which is source and drain is possible by the following approach. Starting at the highest level of metal, say M3, determine which M3 is touching a Vdd label, and which is touching a Vss level [Calibre operation 'touching' determines if one shape is on top of another]. Then have the algorithm find the V2 (via 2 layer) touching the Vss or Vdd M3, then find the M2 touching the V2 Vss or Vdd, then find the V1 touching the Vss or Vdd M2, then find the M1 touching the V1 Vss or Vdd, then find the CA touching the M1 Vss or Vdd. Typically, most layout manipulation tools have built in functions for determining shapes connected to a particular electrical wiring node, so this step is very straight forward. All contacts (CA's) that either connect to Vss or Vdd are then known. The contacts connected to Vss are defined as CAN, and the ones connected to Vdd are defined as CAP.

At step 306, the PFET SD shapes are covered with NW (Pfet well shapes), and the NFET SD shapes are not covered by NW.

A potential PFET source region is covered by NW, the PFET well implant. This is used, at step 308, as a screening criteria in the algorithm. The SD region that is covered by an NW shape can be defined as SDP. All other SD shapes not covered by NW are therefore NFET shapes, and they are defined as SDN (again, a layout manipulation tool command).

The PFET SDP levels that touch a CAP are PFET source regions, and the NFET SDN levels that touch a CAN are NFET source regions. This is part of the operation of the layout manipulation tool.

For a single fingered FET pair (i.e., as in a CMOS inverter), the procedure would be done now, however, in most static logic, there can be several NFETs or PFETs connected in series to form logic operations (such as in NAND and NOR circuits). In these cases, the above algorithm is repeated at step 310 to evaluate the position of the source in the next FET in the series connection. For this part of the algorithm, all previously evaluated FET source locations are connected to the drain region of the same FET, thereby shunting the FET and then defining the source region for the next device in the stack. This process is iterated for the highest number of stacked devices (devices connected in series) for a given design. Typically, this would be on order 3-4 levels of iteration.

Step 314 is to find the source regions that are pointed up, and those that are pointed down. Generally, this is done by flattening the PC shapes (by removing the hierarchy on the shapes) and translating the flattened PC shape a small distance vertically upward and downward. The flattened PC shape is translated vertically to find "up", and specifically, SD shapes that are touched by the translated PC are source regions that are pointed "up," and those that are not touched are source regions that are pointed "down."

Typical layout design is hierarchical, with some standard cells (bits of layout) re-used multiple times. These cells may be rotated in any fashion, so there is no clear way of knowing up from down. In an embodiment of the invention, the following operation is performed to find up from down. Using the top cell in a given design, the wafer reference is then valid, as the top cell is what is used to make the lithographic mask, and therefore absolute directions (i.e., up vs. down) are then valid at this level (and only at this level). At this level, the layout manipulation tool is instructed to 'flatten' or remove the hierarchy from the gate level (PC). By doing so, a level is obtained that can be manipulated with the layout manipulation tool to shift up or down in absolute coordinates. If the gate level is shifted 'up' by a small amount and it touches SDN, that SDN is a source up level FET, which will need an AG shape. If the PC level is shifted down slightly and it touches a SDN shape, this SDN shape is a source down level FET and will require an AH shape.

A similar approach may be used to identify up and down PFET source regions. The layout manipulation tool is instructed to flatten, or remove the hierarchy from, the gate level (PC). The resulting gate level is translated up, and if that gate level touches a SDN level, that SDN level is a PFET source region that points up. If the gate level is shifted down and touches an SDN level, that SDN level is a PFET source region that points down.

The next step 316 is to follow and autogenerate AJ/AK, AG/AH based upon sizing and shifting the relevant SD shapes. Once the location of the SDN and SDP shapes is know, the layout manipulation tool is used to copy these shapes to either the AG, AH, AJ, or AK levels. Then, the appropriate sizing is applied to make these shapes consistent with the technologies requirements for these implant masking levels.

Figure 4:
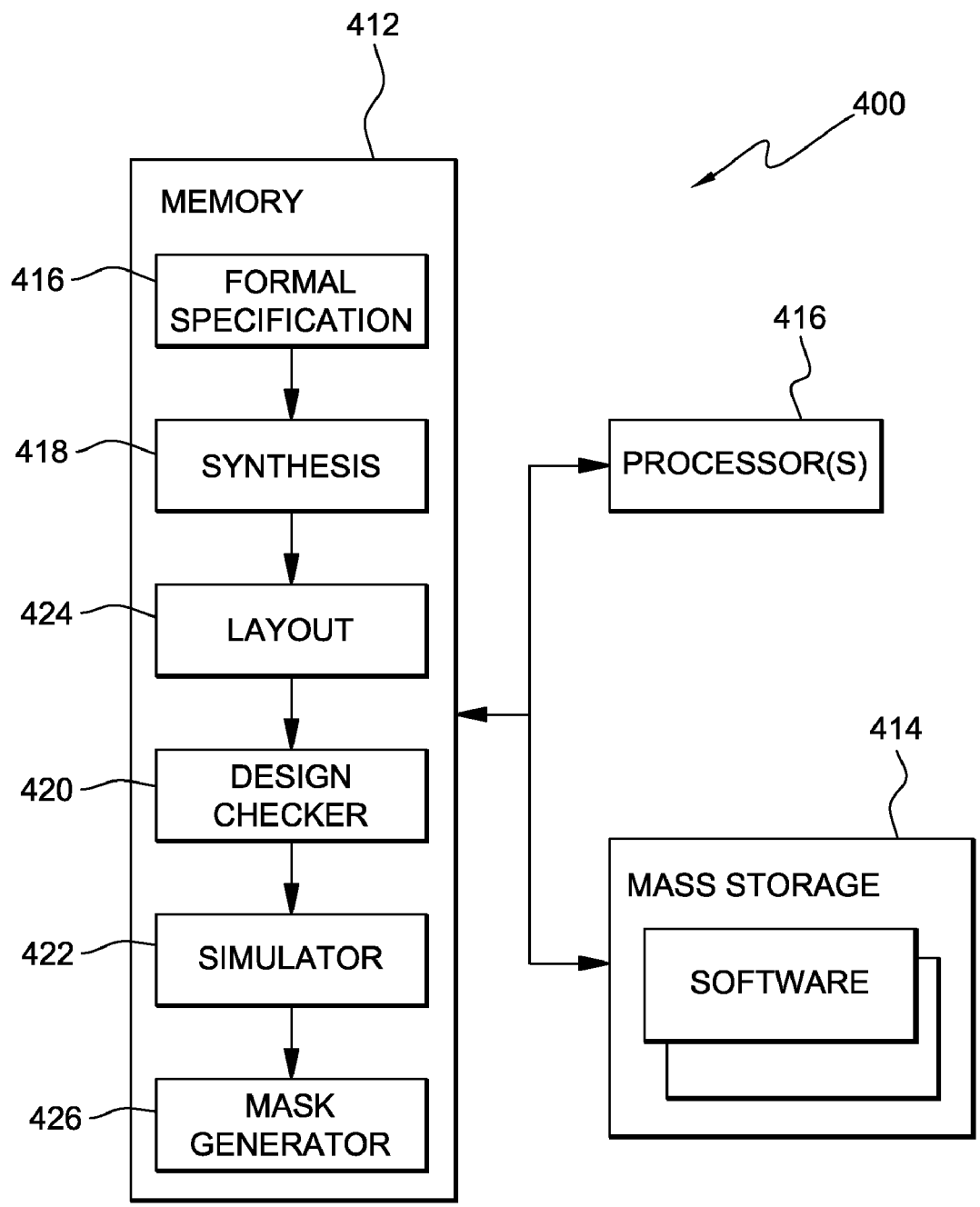
FIG. 4 is a functional diagram of an electronic design automation system in which an embodiment of the invention is incorporated.

FIG. 4 illustrates an EDA system 400 in which one embodiment according to the present invention is used. The EDA system 400 uses multiple pieces of software for the computer aided design for complex ICs. The EDA system includes volatile and non-volatile storage 412 and 414 for storing temporal and persistent copies of the various pieces of software. The EDA system further includes a number of processors 416 couples to the storages 412 and 414 to execute the various software. The elements may be couples to each other via local buses, system buses, peripheral buses, local area networks or wide area networks. In other words, EDA system 410 may be a standalone system, a cluster system, a local or remotely distributed system. The software includes a software suite of a formal specification compiler 416 and synthesis software 418 for use by a circuit designer to specify and generate an IC circuit design. The design may be stored in storage 412 and 414, and called up and displayed on a display device (not shown). The software also includes a design checker 420 and a circuit simulation program 422 to check and test the circuit operation. The software further includes a layout program 424 for use to generate component placement and layout of the integrated circuit. The software may also include a mask generation program 426 to generate the specifications for the masks for manufacture of the integrated circuit.

Figure 5:
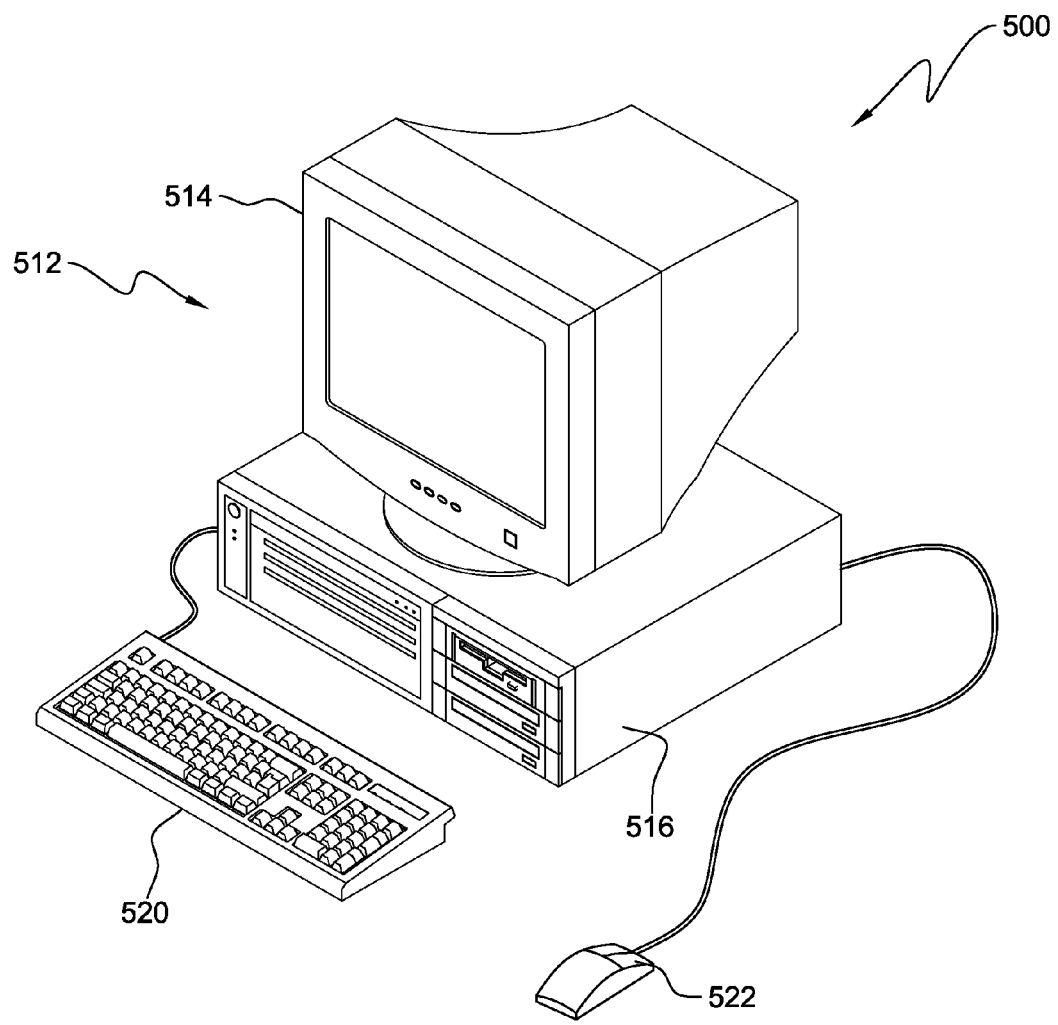
FIG. 5 is a block diagram showing an example computer system in which an embodiment of the invention is implemented.

FIG. 5 is a block diagram illustrating an example of a system 500 in which an embodiment of the invention is implemented. System 500 comprises a personal computer 512 that may include a display unit 514, which may be a cathode ray tube (CRT), a liquid crystal display, or the like; a processing unit 516; and one or more input/output devices that permit a user to interact with the software application being executed by the personal computer. In the illustrated example, the input/output devices may include a keyboard 520 and a mouse 522, but may also include other peripheral devices, such as printers, scanners, and the like. The processing unit 516 may further include a central processing unit (CPU), including a persistent storage device such as a hard disk, a tape drive, an optical disk system, a removable disk system, or the like, and a memory. The CPU may control the persistent storage device and memory. Typically, a software application may be permanently stored in the persistent storage device and then may be loaded into the memory when the software application is to be executed by the CPU. In the example shown, the memory may contain an IC design tool. The IC design tool may be implemented as one or more software modules that are executed by the CPU.

Thus, methods, systems, and computer program products for creating block level shapes to manufacture asymmetric field effect transistors have been described. In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of generating block level shapes to manufacture asymmetric field effect transistors (FETs) comprising:
obtaining an integrated circuit design having a multitude of levels including an active region level and a gate region level, each of the active region and gate levels having a multitude of shapes representing semiconductor regions;
defining a new source-drain level having a multitude of source-drain level shapes from the level active region shapes and the gate level shapes, and whereby two new source-drain level shapes result from each of the active region level shapes, and one of said two new source-drain level shapes is a source region and the other of said two new source-drain level shapes is a drain region; wherein in some of said two new source-drain level shapes, the source region of said two new shapes is in a defined up position relative to the drain region of said two new shapes; and in others of said two new source-drain level shapes, the source region of said two new shapes is in a defined down position relative to the drain region of said two new shapes;

identifying which ones of the new shapes are source regions, and which ones of the new shapes are drain regions;

determining which ones of the identified source regions are in the defined up position and which ones of the identified source regions are in the defined down position, according to given rules;

defining a plurality of additional levels; and copying the shapes of the source regions that are position up and the shapes of the source regions that are in the defined down position onto said additional levels.

2. The method according to claim 1, wherein the identifying includes identifying which ones of the identified source regions are NFET source regions, which ones of the identified source regions are PFET source regions.

3. The method according to claim 2, wherein:

the defining a plurality of additional levels includes defining a first set of additional levels, and defining a second set of additional levels; and the copying includes copying the shapes of the NFET source regions onto the first set of additional levels, and copying the shapes of the PFET source regions onto the second set of additional levels.

4. The method according to claim 3, wherein:

the defining a plurality of additional levels further includes defining a third additional level and a fourth additional level; and the copying further includes copying the shapes of the PFET source regions that are in the defined up position onto said third additional level, and copying the shapes of the PFET drain regions that are in the defined down position onto said fourth additional level.

5. The method according to claim 2, wherein:

the defining a plurality of additional levels include defining at least first and second additional levels; and the copying includes copying the shapes of the NFET source regions that are in the defined up position onto said first additional level, and copying the shapes of the NFET source regions that are in the defined down position onto said second additional level.

6. The method according to claim 1, wherein the determining which ones of the identified source regions are in the defined up position and which ones of the identified source regions are in the defined down position, includes generating a display of said identified source regions and using said view to identify which ones of the identified source regions are in the defined position and which ones of the identified source regions are in the defined down position.

7. The method according to claim 6, wherein the generating a display includes generating a hierarchical display of the identified source regions, wherein said identified source regions are shown in a hierarchical order; and removing said hierarchical order from the hierarchical display to show the identifies source regions in flattened order; and using said flattened display of the identifies source regions to determine which ones of the source regions are in the defined up position and which ones of the source regions are in the defined down position.

8. The method according to claim 1, wherein the determining which ones of the identified source regions are in the defined up position and which ones of the identified source regions are in the defined down position, includes generating a display of said identified source regions and using said view to identify which ones of the identified source regions are in the defined position and which ones of the identified source regions are in the defined down position.

9. A method of generating block level shapes to manufacture asymmetric field effect transistors (FETs) comprising:

obtaining an integrated circuit design having a multitude of levels including an active region level and a gate region level, each of the active region and gate levels having a multitude of shapes representing semiconductor regions;

defining a new source-drain level having a multitude of source-drain level shapes from the active region level shapes and the gate level shapes, and whereby two new source-drain level shapes result from each of the active region level shapes, and one of said two new level source-drain shapes is a source region and the other of said two new source-drain level shapes is a drain region;

identifying which ones of the new shapes are source regions, and which ones of the new shapes are drain regions;

determining which ones of the identified source regions are pointing up and which ones of the identified source regions are pointing down, according to defined rules for the integrated circuit design;

defining a plurality of additional levels;

copying the shapes of source regions that are pointing up and the shapes of the source regions that are pointing down onto said additional levels; and using a computer system, implementing an electronic design program, to perform the steps of identifying which ones of the new shapes are source regions, and which ones of the new shapes are drain regions, determining which ones of the identified source regions are pointing up and which ones of the identified source regions are pointing down, and copying the shapes of source regions that are pointing up and the shapes of the source regions that are pointing down onto said additional levels; and wherein:

the integrated circuit design includes a Vdd node and a Vss node; and the step of identifying which ones of the identified source regions are NFET source regions, and which ones of the identified source regions are PFET source regions includes using said Vdd node and said Vss node to identify which ones of the identified source regions are NFET source regions, and which ones of the identified source regions are PFET source regions.

10. The method according to claim 9, wherein the using the Vdd node and said Vss node includes tracing said new shapes that are source regions to one of said Vdd node and said Vss node.

11. The method according to claim 10, wherein the tracing includes identifying the new source regions that trace to the Vss node as NFET source regions, and identifying the new source regions that trace to the Vdd node as PFET source regions.

12. A system for generating block level shapes to manufacture asymmetric field effect transistors (FETs), for use with an integrated circuit design having a multitude of levels including an active region level and a gate region level; each of the active region and gate levels having a multitude of shapes representing semiconductor regions, the system comprising one or more processing units configured for:

defining a new source-drain level having a multitude of source-drain level shapes from the active region level shapes and the gate level shapes, and whereby two new source-drain level shapes result from each of the active region level shapes, and one of said two new source-drain level shapes is a source region and the other of said two new level shapes is a drain region; wherein in some of said two new source-drain level shapes, the source region of said two new shapes is in a defined up position relative to the drain region of said two new shapes; and in others of said two new source-drain level shapes, the source region of said two new shapes is in a defined down position relative to the drain region of said two new shapes;

identifying which ones of the new shapes are source regions, and which ones of the new shapes are drain regions;

determining which ones of the identified source regions are in the defined up position and which ones of the identified source regions are in the defined down position, according to given rules;

defining a plurality of additional levels; and copying the shapes of the source regions that are in the defined up position and the shapes of the source regions that are in the defined down position onto said additional levels.

13. The system according to claim 12, wherein:

the identifying includes identifying which ones of the identified source regions are NFET source regions, which ones of the identified source regions are PFET source regions;

the defining a plurality of additional levels includes defining a first set of additional levels, and defining a second set of additional levels; and the copying includes copying the shapes of the NFET source regions onto the first set of additional levels, and copying the shapes of the PFET source regions onto the second set of additional levels.

14. The system according to claim 13, wherein:

the defining a plurality of additional levels include defining at least first, second, third, and fourth additional levels; and the copying includes copying the shapes of the NFET source regions that are in the defined up position onto said first additional level, copying the shapes of the NFET source regions that are in the defined down position onto said second additional level, copying the shapes of the PFET source regions that are in the defined up position onto said third additional level, and copying the shapes of the PFET drain regions that are in the defined down position onto said fourth additional level.

15. The method according to claim 13, wherein:

the integrated circuit design includes a Vdd node and a Vss node; and the step of identifying which ones of the identified source regions are NFET source regions, and which ones of the identified source regions are PFET source regions includes using said Vdd node and said Vss node to identify which ones of the identified source regions are NFET source regions, and which ones of the identified source regions are PFET source regions.

16. An article of manufacture comprising:

at least one tangible computer readable device having computer readable program code logic tangibly embodied therein to execute machine instructions in one or more processing units for generating block level shapes to manufacture asymmetric field effect transistors (FETs), and for use with an integrated circuit design having a multitude of levels including an active region level and a gate region level, each of the active region and gate levels having a multitude of shapes representing semiconductor regions, said computer readable program code logic, when executing, performing the following:

defining a new source-drain level having a multitude of source-drain level shapes from the active region level shapes and the level shapes, and whereby two new source-drain level shapes result from each of the active region level shapes, and one of said two new source-drain level shapes is a source region and the other of said two new source-drain level shapes is a drain region; wherein in some of said two new source-drain level shapes, the source region of said two new shapes is in a defined up position relative to the drain region of said two new shapes; and in others of said two new source-drain level shapes, the source region of said two new shapes is in a defined down position relative to the drain region of said two new shapes;

identifying which ones of the new shapes are source regions, and which ones of the new shapes are drain regions;

determining which ones of the identified source regions are in the defined up position and which ones of the identified source regions are in the defined down position, according to given rules;

defining a plurality of additional levels; and copying the shapes of the source regions that are in the defined up position and the shapes of the source regions that are in the defined down position onto said additional levels.

17. The article of manufacture according to claim 16, wherein the identifying includes identifying which ones of the identified source regions are NFET source regions, which ones of the identified source regions are PFET source regions.

18. The article of manufacture according to claim 17, wherein:

the defining a plurality of additional levels includes defining a first set of additional levels, and defining a second set of additional levels; and the copying includes copying the shapes of the NFET source regions onto the first set of additional levels, and copying the shapes of the PFET source regions onto the second set of additional levels.

19. The article of manufacture according to claim 17, wherein:

the integrated circuit design includes a Vdd node and a Vss node; and the identifying which ones of the identified source regions are NFET source regions, and which ones of the identified source regions are PFET source regions includes using said Vdd node and said Vss node to identify which ones of the identified source regions are NFET source regions, and which ones of the identified source regions are PFET source regions.

20. The article of manufacture according to claim 16, wherein the determining which ones of the identified source regions are in the defined up position and which ones of the identified source regions are in the defined down position, includes generating a display of said identified source regions and using said view to identify which ones of the identified source regions are in the defined position and which ones of the identified source regions are in the defined down position.

21. A method of generating block level shapes to manufacture asymmetric field effect transistors (FETs) comprising:
  obtaining an integrated circuit design having a multitude of levels including an active region level and a gate region level, each of the active region and gate levels having a multitude of shapes representing semiconductor regions;
  defining a new source-drain level having a multitude of source-drain level shapes from the active region level shapes and the gate level shapes, and whereby two new source-drain level shapes result from each of the active region level shapes, and one of said two new source-drain level shapes is a source region and the other of said two new source-drain level shapes is a drain region; wherein in some of said two new source-drain level shapes, the source region of said two new shapes is in a defined up position relative to the drain region of said two new shapes; and in others of said two new source-drain level shapes, the source region of said two new shapes is in a defined down position relative to the drain region of said two new shapes;
  identifying which ones of the new shapes are NFET source regions;
  determining which ones of the identified source regions are in the defined up position and which ones of the identified source regions are in the defined down position, according to given rules;
  defining at least first and second additional levels; and
  copying the shapes of NFET source regions that are in the defined up position onto the first additional level, and copying the shapes of the NFET source regions that are in the defined down position onto said second additional level.

22. The method according to claim 21, wherein:
  the identifying includes identifying which ones of the new shapes are PFET source regions;
  determining which ones of the identified PFET source regions are in the defined up position and which ones of the identified PFET source regions are in the defined down position, according to said given rules;
  the defining includes defining third and fourth additional levels; and
  the copying includes copying the shapes of the PFET source regions that are in the defined up position onto the third additional level, and copying the shapes of the PFET source regions that are in the defined down position onto the fourth additional level.

23. The method according to claim 22, wherein:
  the integrated circuit design includes a Vdd node and a Vss node; and
  the identifying which ones of the identified source regions are NFET source regions, and which ones of the identified source regions are PFET source regions includes using said Vdd node and said Vss node to identify which ones of the identified source regions are NFET source regions, and which ones of the identified source regions are PFET source regions.

24. A system for generating block level shapes to manufacture asymmetric field effect transistors (FETs) comprising one or more processing unit configured for:
  processing an integrated circuit design having a multitude of levels including an active region level and a gate region level, each of the active region and gate levels having a multitude of shapes representing semiconductor regions;
  defining a new source-drain level having a multitude of source-drain level shapes from the active region level shapes and the gate level shapes, and whereby two new source-drainlevel shapes result from each of the active region level shapes, and one of said two new source-drain level shapes is a source region and the other of said two new level shapes is a drain region; wherein in some of said two new source-drain level shapes, the source region of said two new shapes is in a defined up position relative to the drain region of said two new shapes; and in others of said two new source-drain level shapes, the source region of said two new shapes is in a defined down position relative to the drain region of said two new shapes;
  identifying which ones of the new shapes are NFET source regions and which ones of the new shapes are PFET source regions;
  determining which ones of the identified NFET source regions are in the defined up position and which ones of the identified NFET source regions are in the defined down position, according to given rules;
  defining at least first and second additional groups of levels; and
  copying the shapes of NFET source regions onto the first additional group of levels, and copying the shapes of the PFET source regions onto said second group of additional levels.

25. The system according to claim 24, wherein the determining which ones of the identified source regions are in the defined up position and which ones of the identified source regions are in the defined down position, includes:
  generating a hierarchical display of the identified source regions, wherein said identified source regions are shown in a hierarchical order;
  removing said hierarchical order from the hierarchical display to show the identified source regions in flattened order; and
  using said flattened display of the identifies source regions to determine which ones of the source regions are in the defined up position and which ones of the source regions are in the defined down position.

* * * * *